United States Patent [19]

Wen et al.

[11] Patent Number: 5,272,356

[45] Date of Patent: Dec. 21, 1993

[54] MULTIPLE QUANTUM WELL PHOTODETECTOR FOR NORMAL INCIDENT RADIATION

[75] Inventors: Cheng P. Wen, Mission Viejo; Chan-Shin Wu, Torrance, both of Calif.

[73] Assignee: Hughes Aircraft Company, Los Angeles, Calif.

[21] Appl. No.: 792,519

[22] Filed: Nov. 12, 1991

[51] Int. Cl.$^5$ .................. H01L 27/14; H01L 31/00
[52] U.S. Cl. ............................ 257/21; 257/184; 257/432; 385/36; 385/37
[58] Field of Search ............... 357/30 D, 30 E, 30 L, 357/30 M, 4; 385/36, 37; 257/21, 184, 432

[56] References Cited

U.S. PATENT DOCUMENTS

| 4,453,030 | 6/1984 | David et al. | 357/30 J |
| 4,644,091 | 2/1987 | Hayashi et al. | 357/30 D |
| 4,745,451 | 5/1988 | Webb et al. | 357/30 H |
| 5,080,725 | 1/1992 | Green et al. | 357/30 J |
| 5,097,121 | 3/1992 | Sherman et al. | 357/30 L |

FOREIGN PATENT DOCUMENTS

| 0345972 | 12/1989 | European Pat. Off. | 357/30 E |
| 53-121494 | 10/1978 | Japan | 357/30 L |
| 58-4985 | 1/1983 | Japan | 357/30 D |
| 60-88482 | 5/1985 | Japan | 357/30 L |

OTHER PUBLICATIONS

Goossen et al., "Photovoltaic quantum well infrared detector", Appl. Phys. Lett. 52(20), May 15, 1988.

Levine et al., "High detectivity . . . λ=8.3 μm infrared detector", Appl. Phys. Lett. 53(4), Jul. 25, 1988.

Hasnain et al., "GaAs/AlGaAs multiquantum well . . . etched gratings", Appl. Phys. Lett. 54(25), Jun. 19, 1989.

Levine et al., "Broadband 8-12 μm . . . quantum well infrared photodetector", Appl. Phys. Lett. 54(26), May 26, 1989.

Levine et al., "Bound-to-extended . . . infrared detector", J. Appl. Phys. 64(3), Aug. 1, 1988.

*Primary Examiner*—William Mintel
*Assistant Examiner*—Minhloan Tran
*Attorney, Agent, or Firm*—W. C. Schubert; W. K. Denson-Low

[57] ABSTRACT

A multiple quantum well (MQW) superlattice photodetector, is surmounted by a slab of transparent material having an angled surface that extends upward and away from the photodetector, such that incident radiation which is initially normal to the superlattice undergoes total internal reflection at the angled surface and is reflected onto the detector at a substantially non-normal angle. This off-normal angle allows the radiation to be partially absorbed by the detector. A reflection grating is preferably formed on the opposite side of the detector to redirect received radiation back through the MQW superlattice at an altered angle, such that remaining radiation can be absorbed by the detector during the second pass. The detector is formed upon a substrate, with the slab, substrate and quantum wells all preferably formed from the same type of material. Multiple detectors may be formed in an array upon a common substrate, with a slab providing a common reflective surface for the overall array.

18 Claims, 3 Drawing Sheets

MULTIPLE QUANTUM WELL PHOTODETECTOR FOR NORMAL INCIDENT RADIATION

BACKGROUND OF THE INVENTION

1. Field of the Invention

This invention deals with multiple quantum well photodetectors intended for unpolarized radiation detection.

2. Description of the Related Art

One-dimensional multiple quantum well (MQW) photodetectors have been developed that are sensitive to a greater range of incident radiation than are intrinsic or extrinsic semiconductor photodetectors. With the MQW device, the operating characteristics are controlled by the width and height of the quantum wells, rather than by selecting from limited available materials as with semiconductor photodetectors. An MQW detector can be very thin, on the order of a micron or less, making it much more radiation hard than semiconductor detectors.

MQW detectors are formed from superlattice stacks of ultrathin semiconductor layers, typically Group III-V semiconductors. With these materials the energy bandgap is direct, permitting light to be efficiently emitted or absorbed without the aid of lattice vibrations. Input photons transfer energy to electrons in the wells, exciting the electrons from a ground state, while an electric field moves the electrons through the superlattice. The MQW materials are characterized by large charge carrier mobilities, and are easily doped with impurities. They can form solid solutions of various proportions with identical crystal structures and well-matched lattice parameters, but with different energy bandgaps and indices of refraction.

The detection of long wavelength infrared radiation (LWIR) with MQW detectors has been reported in several publications: Levine et al., "Bound-to-Extended State Absorption GaAs Superlattice Transport Infrared Detectors", *J. Applied Physics Letters* Vol. 64, No. 3, 1 Aug. 1988, pages 1591-1593; Levine et al., "Broadband 8-12 $\mu$m High-Sensitivity GaAs Quantum Well Infrared Photodetector", *Applied Physics Letters* Vol. 54, No. 26, 26 Jun. 1989, pages 2704-2706; Hasnain et al., "GaAs/AlGaAs Multiquantum Well Infrared Detector Arrays Using Etched Gratings", *Applied Physics Letters* Vol. 54, No. 25, 19 Jun. 1989, pages 2515-2517; Levine et al., "High-Detectivity $D^* = 1.0 \times 10^{10}$cm $\sqrt{Hz}/W$ GaAs/AlGaAs Multiquantum Well $\lambda = 8.3$ $\mu$m Infrared Detector", *Applied Physics Letters*, Vol. 53, No. 4, 25 Jul. 1988, pages 296-298.

The described detector consists of a periodic heterostructure of gallium arsenide (GaAs) quantum wells and aluminum gallium arsenide (AlGaAs) barrier layers. The GaAs quantum well layers are doped with an n-type dopant such as silicon to provide electrons in the ground states of the wells for intersubband detection. Under the influence of a bias voltage applied across the MQW structure, electrons excited by incident radiation into a conduction band above the barrier heights flow through the device. This majority current flow is sensed and provides an indication of the amount of LWIR that is incident upon the device.

While one-dimensional MQW photodetectors made of heterojunction material provide flexibility in the optimization of performance for LWIR, especially in the greater than ten micron wavelength range, the quantum efficiency of these devices is limited for unpolarized light detection. This is because they are not sensitive to optical polarization parallel to the detector plane. To excite an electron in a well, the electric field associated with the photons must be perpendicular to the vertical barrier walls (in the first order).

Ideally, the light to be detected would be directed onto the detector at 90 to the detector plane, to obtain the best image. However, since the plane of polarization for a light beam is normal to its direction of propagation, this would place the polarization plane parallel to the detector, so that the beam could be not detected. To compensate for this, the light is normally directed onto the detector at an angle to the detector plane such that a substantial component of the polarization is perpendicular to the detector plane and thus absorbed; at the same time the angle is kept great enough to preserve adequate image clarity. In practice, an incident angle of about 45° has been found to be satisfactory.

Since the component of the incoming beam that has a polarization parallel to the detector plane will not be absorbed by the MQW detector, an inefficiency is built into the system. As the angle between the beam and the detector plane increases, a thicker detector is necessary to obtain the same level of absorption. Thick detectors, however, are undesirable because they are less radiation hard and require a higher operating bias voltage.

The MQW detection problem for unpolarized light is illustrated in FIG. 1, in which an optical beam 2 is shown incident upon an MQW superlattice 4 at a right angle. (The term "optical" is used in its broad sense as including infrared and other regions of the electromagnetic spectrum which an MQW may detect, and is not limited to visible light.) The beam's plane of polarization, illustrated by arrow 6, is perpendicular to the beam, and thus parallel to the plane of the superlattice 4. Since all the photons are polarized in the plane of the superlattice, the beam will not be absorbed in the superlattice and will instead be transmitted through undetected.

The prior technique of directing the beam at an acute incident angle to the MQW superlattice is represented in FIG. 2. The photons of an unpolarized optical beam 8 can be represented by a pair of orthogonal polarization vectors in an arbitrary direction normal to the direction of propagation. For a beam with a 45 incident angle, the polarization vectors can be represented by vector arrows 10 and 12, which lie respectively in planes parallel and perpendicular to the superlattice 4. The photons that are polarized perpendicular to the superlattice in plane 12 will be absorbed as the beam progresses through the superlattice (assuming the superlattice is sufficiently thick), while the photons polarized in plane 10 parallel to the superlattice will not interact with the one-dimensional MQW detector. The output beam after transmission through the superlattice will thus be linearly polarized along a vector 10' parallel to the superlattice. Since this component of the beam has gone wholly undetected, the maximum achievable quantum efficiency of the described MQW photodetector is 50%.

In an attempt to resolve this problem, are fraction grating that reflects and alters the angle of an incident beam of radiation has been placed on the opposite side of the MQW detector from the incident beam. This approach, illustrated in FIG. 3, is described in U.S. Pat. No. 5,026,148, "High Efficiency Multiple Quantum Well Structure and Operating Method", issued Jun. 25, 1991 to Wen et al. and assigned to Hughes Aircraft Company, the assignee of the present invention.

According to this patent, an incident ray 14 directed through a transparent substrate 15 onto an MQW photodetector 16 at an off-normal angle is partially absorbed as it propagates through the detector. Unabsorbed radiation with a polarization parallel to the superlattice is reflected back through the superlattice, at an off-normal angle to the detector surface, by a reflection grating 18 on the rear of the detector. The polarization of the reflected ray is thus shifted to a substantially non-parallel angle to the superlattice. This allows the superlattice to absorb at least part of the reflected radiation during its second pass through the detector. The reflection grating is implemented as either a reflective saw-tooth surface, or a periodic reflective grating pattern.

The patent also describes a version of the photodetector that is designed for incident light normal to the superlattice. This variation is illustrated in FIG. 4. An angular shifting mechanism such as an optical transmission grating 20 is formed on the forward surface of the transparent substrate 15', and redirects a normal input beam 22 into a pair of off-normal subbeams 22a, 22b within the detector. The subbeams are partially absorbed in the superlattice, with the unabsorbed portions reflected off a reflection grating 18' at the rear of the detector. The reflection grating 18' is oriented at a cross-angle to the transmission grating 20. It thus reflects the subbeams 22a and 22b at new angles at which their polarization is again at least partially normal to the superlattice, so that the reflected subbeams are absorbed during their second pass through the detector.

While the cross-grating structure of FIG. 4 provides for up to 100% absorption of incident radiation that reaches the detector in a direction normal to the MQW superlattice, the transmission grating 20 must be located very close to the detector. Otherwise the diffracted light will undergo an excessive lateral spreading that results in pixel "smearing" and serious loss of resolution. The laterally diffracted light consists of both a pair of first order lobes, and higher order diffracted side lobes. With an array of detectors, this lateral spread will result in poor isolation among different detector elements. In a practical device it is difficult to fabricate the transmission grating sufficiently close to the MQW superlattice. With current pixel sizes down to about 40×40 microns, the MQW substrate 15' would have to be comparably thin to avoid pixel smearing. This would result in a very fragile structure.

Another approach to obtaining a non-normal incident angle from radiation that is originally normal to the detector plane involves forming an edge of the substrate upon which the detectors are grown at a non-normal angle, typically 45°. This is discussed, for example, in Goossen et al., "Photovoltaic Quantum Well Infrared Detector", *Applied Physics Letters*, Vol. 52, No. 20, 16 May 1988, pages 1701–1703. However, since only that portion of the incident radiation that falls upon the angled substrate edge will be redirected at a non-normal angle to the detector, the radiation that falls upon the remainder of the substrate will not contribute to a detector output. This approach can be used for a single detector or for a small detector array, but is not useful for larger arrays. Also, the process of forming an angle in the substrate edge places the detectors at risk. Larger detectors arrays can be accommodated by mounting the detector substrate upon a second and considerably larger substrate, with the angled edge moved to the second substrate. Since the second substrate is considerably thicker than the first substrate, it can be configured so that the area of its angled edge is sufficient to illuminate the detector array with non-normal radiation in response to normal radiation incident upon the angled edge. However, the detector structure is relatively fragile because the superlattice chip is not solidly supported in a normal mounting configuration. The weakness in mechanical structure can result in low yield and poor sensor reliability, especially since bandwires must be attached from the detectors to the readout circuitry.

SUMMARY OF THE INVENTION

The present invention seeks to provide an improved MQW superlattice photodetector that is capable of achieving up to 100% quantum efficiency from incident radiation that is originally normal to the photodetector plane, that maintains a high level of resolution, and that is mechanically strong.

These goals are accomplished with an MQW superlattice photodetector in which a reflecting mechanism is used to reflect incident radiation, initially normal to the detector's radiation receiving surface, to a substantially off-normal angle to that surface, while at the same time maintaining the incident beam's initial polarization. The reflection mechanism extends beyond the lateral bounds of the MQW surface to redirect an initially normal incident beam to an angle of preferably about 45° to the detector surface, such that the beam illuminates substantially the full surface area. With a reflection grating on the opposite side of the MQW for reflecting and altering the polarization orientation of radiation transmitted through the MQW, a potential quantum efficiency of 100% is possible.

The reflection mechanism is preferably implemented with a slab of material that is substantially transparent to the radiation to which the MQW is sensitive. The slab is positioned over the detector, and includes an angled surface that extends upward and outward from the detector at a predetermined angle. The slab's surface angle and refractive index are selected so that initially normal radiation to which the MQW is sensitive undergoes total internal reflection at the surface, and is reflected back through the slab onto the MQW at a substantially non-normal angle. The slab is preferably formed from the same type of material as the detector substrate and the quantum well layers.

With an array of MQW detectors arranged on a common substrate, individual slabs can be provided for respective rows of detectors. Each slab covers all of the detectors in its row, and redirects incident normal light in a similar fashion for each detector. There is no significant spreading of the light reflected from the angled slab surface, permitting that surface to be extended substantially above the detectors without degrading the detection resolution. The overall array is relatively compact and high strength.

These and other features and advantages of the invention will be apparent to those skilled in the art from the following detailed description, taken together with the accompanying drawings, in which:

DETAILED DESCRIPTION OF THE INVENTION

Figure 5:
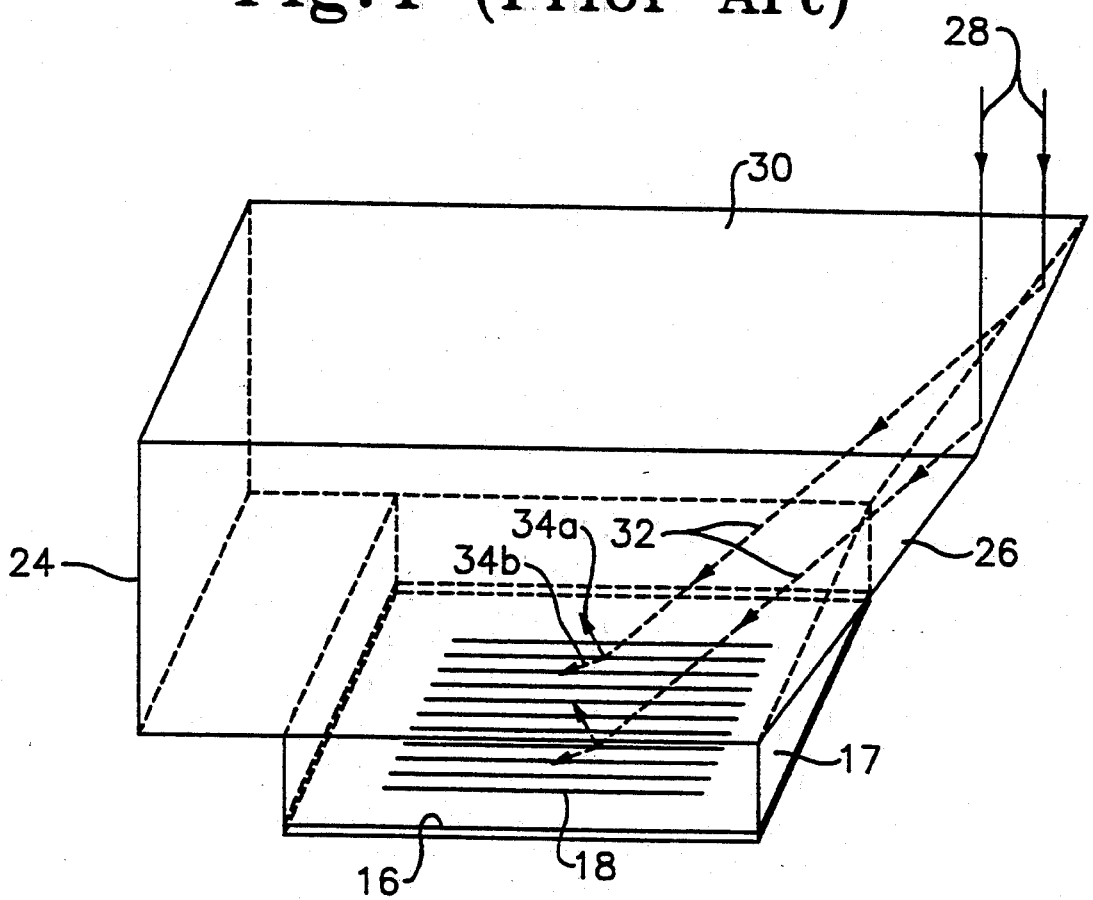
FIG. 5 is a perspective view illustrating a photodetector in accordance with the invention.

A single MQW photodetector implemented in accordance with the invention is shown in FIG. 5. The overall detector structure redirects incoming radiation, initially normal to the MQW, to a substantial off-normal angle with a plane of polarization at a substantial angle to the plane of the MQW. With this orientation, the component of the radiation that has a polarization normal to the MQW can be absorbed (and thus detected) during an initial pass through the MQW.

Figure 1:
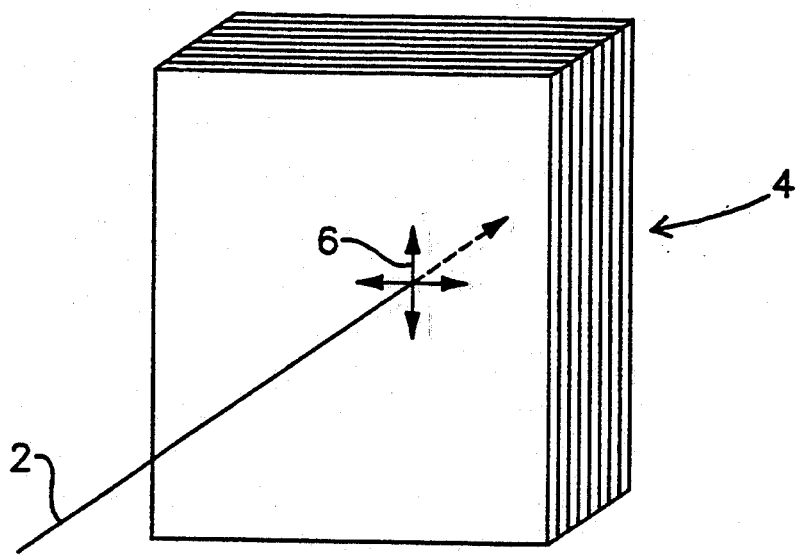
FIG. 1 is a perspective schematic view, discussed above, illustrating the response of an MQW superlattice to a normal incident light beam.
Figure 2:
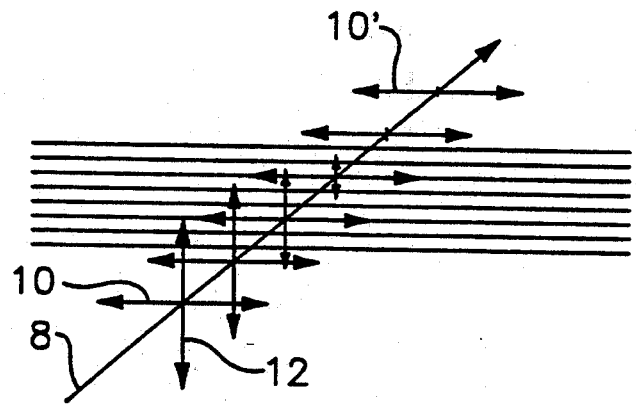
FIG. 2 is a schematic sectional view, discussed above, illustrating the response of an MQW detector to an off-normal incident beam.
Figure 3:
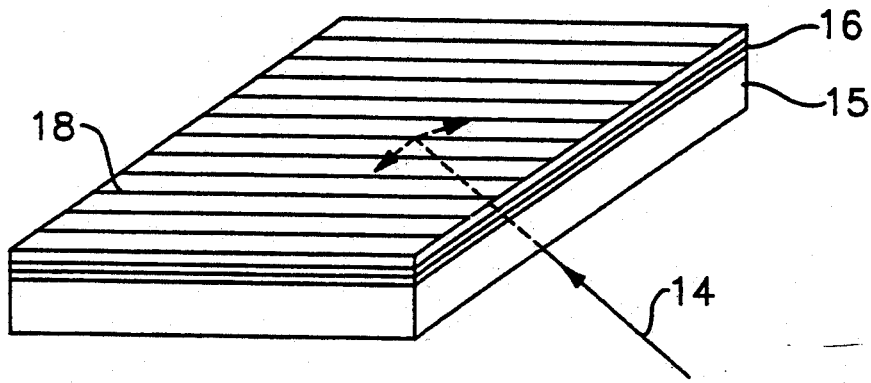
FIGS. 3 and 4 are perspective views, discussed above, of prior attempts to increase the quantum efficiency of an MQW photodetector.
Figure 4:
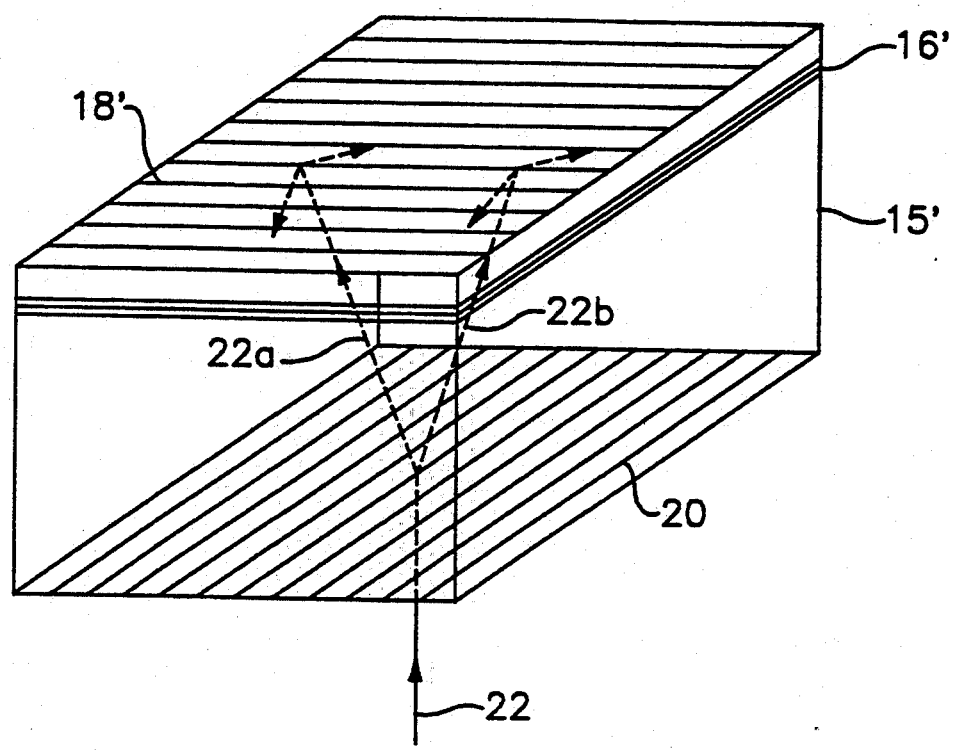

The MQW structure per se is not part of the invention. It is shown schematically as a layer 16 grown upon a semiconductor layer 17. These elements can be the same as in the structure described in U.S. Pat. No. 5,026,148 and illustrated in FIG. 3 herein, and the same reference numerals are used as in FIG. 3. A grating 18 is also preferably formed on the opposite side of the MQW from substrate 17.

Incident radiation is transmitted through the substrate 17 onto the upper radiation receiving surface of the MQW. To redirect radiation that is initially normal to the MQW to an angle at which it can be absorbed, a slab 24 of material that is substantially transparent to the radiation of interest is placed over the substrate 17. The slab 24 has an angled lateral surface 26 that extends upward and outward from the MQW. The angle of this surface 26 is selected such that initially normal incident radiation 28 that passes through the slab above the surface 26 undergoes total internal reflection at the surface and is redirected onto the MQW at a substantially non-normal angle. The upper slab surface 30 is preferably substantially parallel to the MQW surface, and thus does not change the direction of normal incident radiation.

The slab 24 can be attached to the MQW's substrate with an epoxy around the edge of the substrate. The opposing surfaces of the slab and substrate should be polished and butted together as close as possible.

The MQW 16 is preferably monolithically grown on the substrate 17, with the quantum well layers and the substrate preferably formed from the same material. It is also preferable to use this same material for the slab 24 to avoid a refractive index differential, and consequent reflection, at the slab/substrate interface.

A common MQW structure has $Ga_xAl_{1-x}As/GaAs$ barrier/well layers on a semi-insulating GaAs substrate. In this case the slab is also preferably formed from GaAs, which has a refractive index of 3.65. Assuming a GaAs/air interface at angled slab surface 26, forming that surface at a 67.5° angle from the MQW plane will cause incident normal radiation 28 to be totally internally reflected at an angle of about 45° to the MQW, which angle is generally considered to provide a good combination of photoabsorption and resolution. Since total internal reflection will take place for any incident angle greater than 15.9° for a GaAs/air interface, substantially all of the incident radiation should be retained within the slab after reflection from surface 26. The slab preferably extends far enough above the surface of substrate 17 so that radiation reflected off of surface 26 will illuminate substantially the entire MQW. Since a planar reflection mechanism is used to redirect an incoming beam, the beam's original collimation is substantially maintained upon reflection, thus preserving the image resolution.

The reflection grating 18 is oriented so that radiation 32 reflected from slab surface 26 is again reflected by the grating 18 as a pair of principle lobes 34a, 34b (plus side lobes thereof) whose polarization plane is substantially reoriented from that of the incoming radiation 32. Radiation that has not been absorbed during its first pass through the MQW can thus be absorbed after reflection from the grating 18. With a proper radiation-MQW angle (preferably 45°) and a sufficiently thick MQW, in principal 100% absorption can be obtained.

Figure 6:
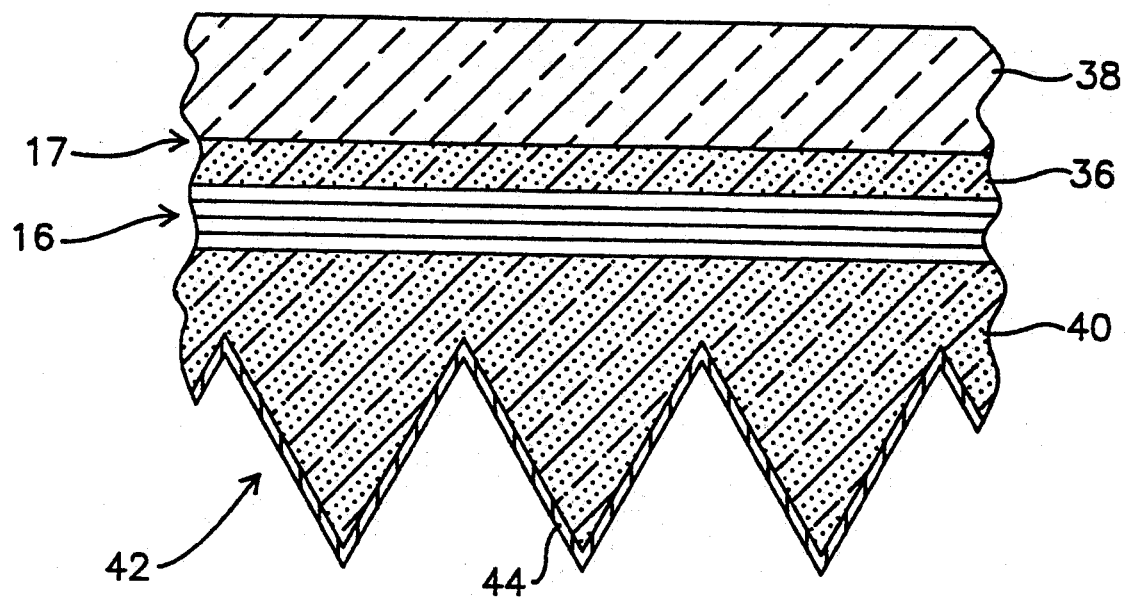
FIG. 6 is an enlarged sectional view of an MQW superlattice, supporting substrate and reflection grating that can be used for the photodetector of FIG. 5.

A suitable construction for the substrate, MQW superlattice and reflection grating is illustrated in FIG. 6. The one-dimension MQW superlattice 16 is fabricated on the front substrate 17, such as by epitaxially growing multilayer $Ga_xAl_{1-x}As/GaAs$ layers on the semi-insulating GaAs substrate 17. The lower substrate portion 36 is heavily doped to provide an electrical contact to the upper radiation receiving surface of the superlattice, while the upper substrate portion 38 may be semi-insulating (intrinsic). The substrate material is essentially transparent to long wavelength beams with wavelengths exceeding 10 microns, while the MQW 16 is sensitive to radiation within this range of wavelengths. The device could be made sensitive to other wavelengths by a suitable selection of materials.

A back substrate 40 is formed on the opposite side of superlattice 16 from the front substrate 17. Back substrate 40 is also formed from GaAs for LWIR applications, and is heavily doped to provide a back electrical contact to the superlattice. The rear of the back substrate 40 is provided with a reflective optical grating, which in this embodiment is a saw tooth edge 42 with a reflective coating 44 such as titanium or gold on its rear surface. Grating 42 is oriented at a cross-angle to radiation that has been reflected off slab surface 26, so that the radiation reflected off the grating will be absorbed by the superlattice during its second pass.

Various types of alternate gratings may be used in place of the etched grating shown in FIG. 6. For the general purposes of the invention, any structure that shifts the angle of the optical beam after its first pass through the MQW superlattice so that the reflected beam has a substantial polarization component non-parallel to the superlattice may be used for the "grating". For example, a series of deposited metal or dielectric strips may be deposited on the rear surface of the back substrate 40. The grating pitch should be on the order of the beam wavelength to obtain a grating effect that shifts the angle of the incoming beam. The angle of reflection depends upon the ratio of the grating pitch to the beam wavelength, in accordance with well known optical grating principles. A layer of reflecting material, such as titanium or gold, would be laid down over the back substrate and grating strips to provide the necessary reflection for the beam's second pass through the MQW superlattice 16.

Figure 7:
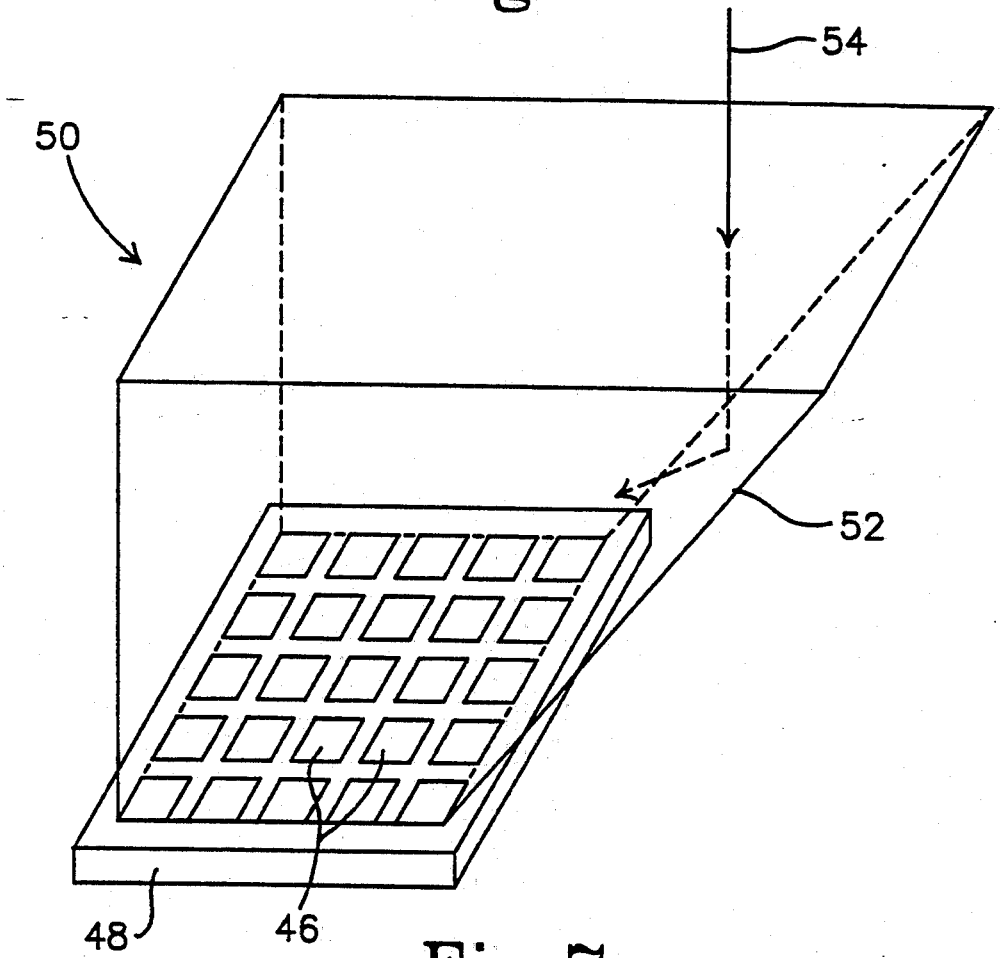
FIG. 7 is a perspective view of a photodetector array with a unitary slab that alters the direction of normal incident radiation for each detector within the array.

The invention is particularly applicable to photodetector arrays, such as the focal plane array illustrated in FIG. 7. While a 5×5 array is shown for simplicity, a practical array would have more on the order of 100×100 pixels. Individual photodetectors 46 of the type illustrated in FIG. 5 are fabricated upon a common substrate 48. The detectors 46 are preferably arranged in rows and columns, with each detector functioning as a pixel within the overall array. A common reflection slab 50 spans the entire array, with an angled surface 52 extending upward and outward from one edge of the array to reflect normal incident radiation 54 onto the detectors at a substantially off-normal angle, as described above. The slab 50 is preferably formed from the same material as the substrate 48 and superlattice barrier layers. Similar considerations govern the selection of the angle for reflective surface 52 as for the single detector of FIG. 5. A reflective grating may be formed on the underside of each detector 46 to reflect received radiation at about 45° to the MQW planes.

While a number of different embodiments of the invention have been shown and described, numerous variations and alternate embodiments will occur to those skilled in the art. Accordingly, it is intended that the invention be limited only in terms of the appended claims.

We claim:

1. A multiple quantum well (MQW) superlattice photodetector, comprising:
    an MQW that is sensitive to radiation within a predetermined waveband, said MQW having a radiation receiving surface located in a plane, and
    a slab of material that is substantially transparent to radiation within said predetermined waveband disposed over said MQW radiation receiving surface, said slab having an angled surface that extends upward and outward from said MQW at a predetermined angle, said angle and the refractive index of said slab being selected so that radiation within said predetermined waveband that initially travels through said slab toward said angled surface in a direction normal to the plane in which said radiation receiving surface is located undergoes substantially total internal reflection at said angled surface, and is reflected therefrom through the slab onto said radiation receiving surface at an angle that is substantially non-normal to said radiation receiving surface.

2. The photodetector of claim 1, said MQW being formed on a substrate, wherein said substrate and slab are formed form the same type of material.

3. The photodetector of claim 1, said slab material comprising GaAs.

4. The photodetector of claim 3, wherein said angled surface is oriented at an angle of about 67.5° to said radiation receiving surface, thereby reflecting normal 10 micron wavelength radiation received by said angled surface to an angle of about 45° to said radiation receiving surface.

5. The photodetector of claim 1, wherein said angled surface is oriented to reflect normal radiation within said predetermined waveband to an angle of about 45° to said radiation receiving surface.

6. The photodetector of claim 1, further comprising a reflection grating on the opposite side of said MQW from said slab for reflecting radiation transmitted through the MQW from said slab, so that at least some of said radiation that is transmitted through the MQW prior to reaching sad reflection grating is absorbed by the MQW after reflection from said grating.

7. The photodetector of claim 6, wherein said angled surface and said reflection grating each reflect said initially normal radiation to an angle of about 45° to said radiation receiving surface.

8. The photodetector of claim 1, said MQW comprising alternating quantum well and barrier layers, wherein said quantum well layers and said slab are formed from the same type of material.

9. The photodetector of claim 1, wherein said slab has a radiation receiving surface that is substantially parallel to the radiation receiving surface of said MQW.

10. A multiple quantum well (MQW) superlattice photodetector array, comprising:
    a substrate,
    a plurality of mutually spaced MQW detectors arranged in an array on said substrate, said MQW detectors having respective radiation receiving surfaces lying in a plane and being sensitive to radiation within a predetermined waveband, and
    a slab of material that is substantially transparent to radiation within said predetermined waveband spanning said detectors and disposed over their respective radiation receiving surfaces, said slab having an angled surface that extends upward and outward from said detectors at a predetermined angle, said angle and the refractive index of said slab being selected so that radiation within said predetermined waveband that initially travels through said slab toward said angled surface in a direction normal to the plane of said radiation receiving surfaces undergoes substantially total internal reflection at said angled surface, and is reflected therefrom through the slab onto said detector array at an angle that is substantially non-normal to said radiation receiving surfaces.

11. The photodetector array of claim 10, wherein said substrate and slab are formed from the same type of material.

12. The photodetector array of claim 10, said slab material comprising GaAs.

13. The photodetector array of claim 12, wherein said angled surface is oriented at an angle of about 67.5° to said detector radiation receiving surfaces, thereby reflecting normal 10 micron wavelength radiation received by said angled surface to an angle of about 45° to said detector radiation receiving surfaces.

14. The photodetector array of claim 10, wherein said angled surface is oriented to reflect normal radiation within said predetermined waveband to an angle of about 45° to said detector radiation receiving surfaces.

15. The photodetector array of claim 10, further comprising respective reflection gratings on the opposite sides of said detectors from said slab for reflecting radiation transmitted through said detectors from said slab, whereby at least some of said radiation that is transmitted through said detectors prior to reaching their respective reflection grating is absorbed by said detectors after reflection from said gratings.

16. The photodetector array of claim 15, wherein said angled surface and the reflection gratings for said detectors each reflect said initially normal radiation to an angle of about 45° to said detector radiation receiving surfaces.

17. The photodetector array of claim 10, said MQWs comprising alternating quantum well and barrier layers, wherein said quantum well layers and said slab are formed from the same type of material.

18. The photodetector array of claim 10, wherein said slab has a radiation receiving surface that is substantially parallel to the radiation receiving surfaces of said detectors.

* * * * *